(12) United States Patent
Embong et al.

(10) Patent No.: US 6,479,893 B2
(45) Date of Patent: Nov. 12, 2002

(54) BALL-LESS CLIP BONDING (75) Inventors: Saat Shukri Embong, Kuala Terengganu (MY); Chee Chew Hiong, Negeri Sembilan (MY)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/728,390

(22) Filed: Dec. 4, 2000

(65) Prior Publication Data
US 2002/0066963 A1 Jun. 6, 2002

(51) Int. Cl.$^7$ .......................... H01L 23/48; H01L 23/52
(52) U.S. Cl. .................. 257/690; 257/784; 257/734
(58) Field of Search ................ 257/734, 784, 257/690

(56) References Cited

U.S. PATENT DOCUMENTS

| 3,750,277 A | * | 8/1973 | Happ | 29/589 |
| 6,316,830 B1 | * | 11/2001 | Lin | 257/737 |
| 6,351,025 B1 | * | 2/2002 | Ohsawa et al. | 257/673 |

FOREIGN PATENT DOCUMENTS

| JP | 07-272980 | * | 10/1995 |
| JP | 11-224928 | * | 8/1999 |

* cited by examiner

Primary Examiner—Phat X. Cao (57) ABSTRACT

A semiconductor component includes a semiconductor chip (120, 1120), an electrically conductive adhesive located over the semiconductor chip, and a clip bond (231, 232, 1231, 1232) located over the electrically conductive adhesive. The clip bond has at least one burr to retain the electrically conductive adhesive.

3 Claims, 10 Drawing Sheets

BALL-LESS CLIP BONDING

FIELD OF THE INVENTION

This invention relates to electronics, in general, and to semiconductor components and methods of manufacturing, in particular

BACKGROUND OF THE INVENTION

A semiconductor component typically includes a metal lead frame, a semiconductor die mounted on the metal lead frame, and wire bonds electrically connecting the semiconductor die to the metal lead frame. The electrical performance of this type of semiconductor component suffers from high electrical resistance and inductance of each of the wire bonds. Furthermore, the manufacturing process of this type of semiconductor component suffers from low throughput.

Another type of semiconductor component uses clip bonds to electrically connect the semiconductor die to the metal lead frame. This type of semiconductor component does not suffer from the aforementioned problems of high electrical resistance and high electrical inductance of wire bonds. This type of semiconductor component is not, however, compatible with small pitch interconnect schemes because of an electrical shorting problem occurring during solder reflow.

Yet another type of semiconductor component uses a ball grid array and clip bonds to permit more precise interconnect bonding. This type of semiconductor component does not use a metal lead frame. The manufacturing process for this type of semiconductor component, however, is relatively expensive and is not compatible with low cost packaging schemes. Accordingly, a need exists for a semiconductor component having improved electrical performance resulting from low parasitic resistances and low parasitic conductances. A need also exists for the semiconductor component to be compatible with small pitch interconnect schemes. Another need exists for a method of manufacturing the semiconductor component to have a high throughput and low cost.

BRIEF DESCRIPTION OF THE DRAWINGS

The invention will be better understood from a reading of the following detailed description, taken in conjunction with the accompanying drawing figures in which.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein. Moreover, the terms top, bottom, over, under, and the like in the description and in the claims, if any, are used for descriptive purposes and not necessarily for describing relative positions. It is understood that the terms so used are interchangeable under appropriate circumstances and that the embodiments of the invention described herein are capable of operation in other orientations than described or illustrated herein.

DETAILED DESCRIPTION OF THE DRAWINGS

Figure 1:
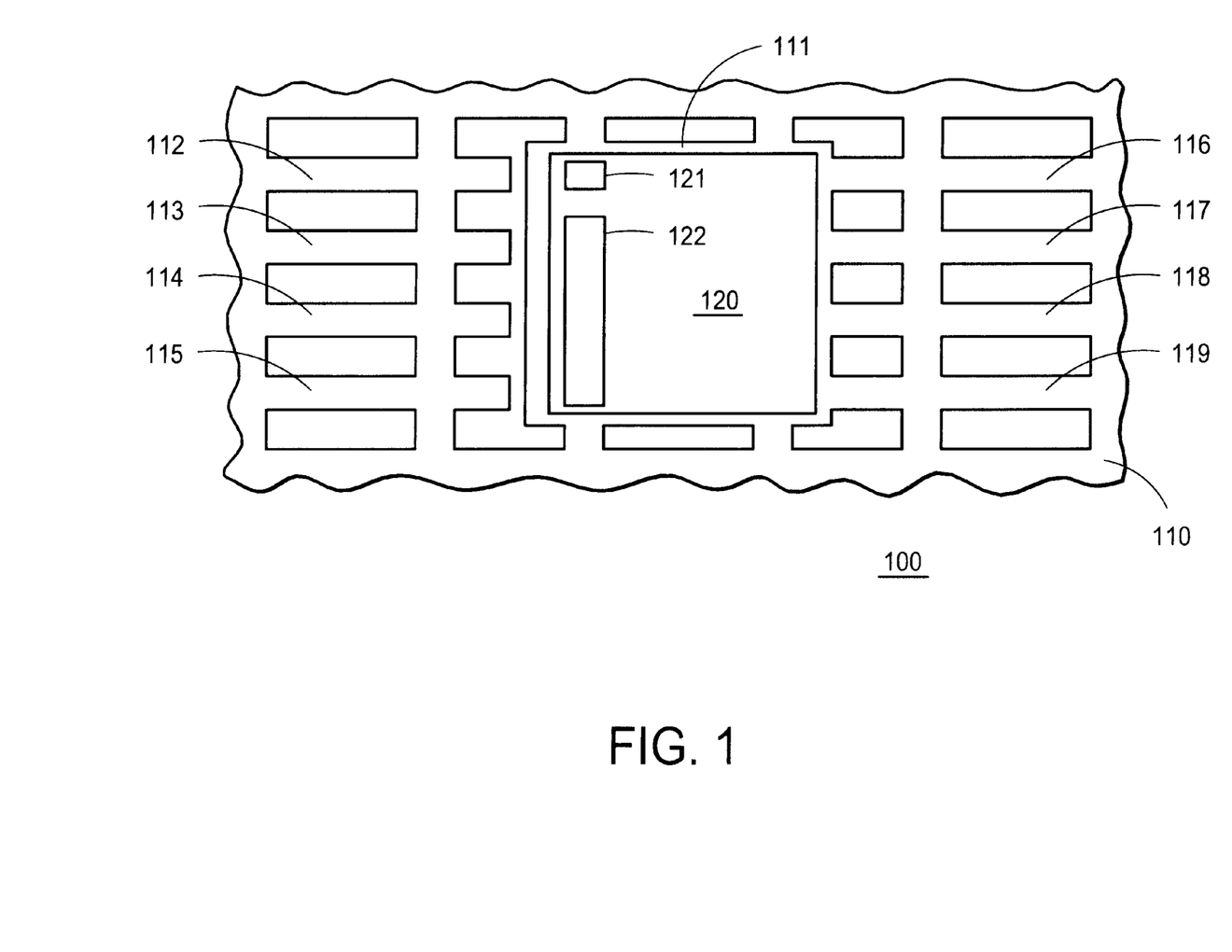
FIG. 1 illustrates a top view of a portion of a semiconductor component in accordance with and embodiment of the invention.

FIG. 1 illustrates a top view of a portion of a semiconductor component 100. As explained hereinafter, semiconductor component 100 comprises, among other features, a semiconductor chip, an electrically conductive adhesive located over the semiconductor chip, and a clip bond located over the electrically conductive adhesive and the semiconductor chip. The clip bond has at least one burr. The clip bond can also include at least one hole, notch, or via located over the electrically conductive adhesive. The burr or burrs are located adjacent to a perimeter of each of the hole or holes such that the configuration of the hole or holes and the burr or burrs retain or hold the electrically conductive adhesive in place, even when the electrically conductive adhesive is melted.

As illustrated in FIG. 1, semiconductor component 100 includes, among other features, a lead frame 110. In the preferred embodiment, lead frame 110 is a stamped metal lead frame and includes a flag portion 111 and a plurality of leads 112, 113, 114, 115, 116, 117, 118, and 119. Tie bars and dam bars physically coupled together flag portion 111 and leads 112 through 119. One skilled in the art will understand that lead frame 110 is one of a plurality of lead frames formed from a single sheet of metal. In other embodiments, lead frame 110 can be a ceramic chip carrier, a ball grid array substrate, or the like.

Component 100 also includes a semiconductor chip 120. Chip 120 is mounted over flag portion 111 of lead frame 110. Chip 120 includes a semiconductor substrate and can also include a plurality of semiconductor, metal, and dielectric or non-electrically conductive layers. The substrate and layers of chip 120 are patterned and optionally doped to form a semiconductor device within chip 120. In the preferred embodiment, the semiconductor device is a discrete transistor. In another embodiment, the semiconductor device can be an integrated circuit. Chip 120 further includes bonding pads 121 and 122 electrically coupled to the semiconductor device.

Figure 2:
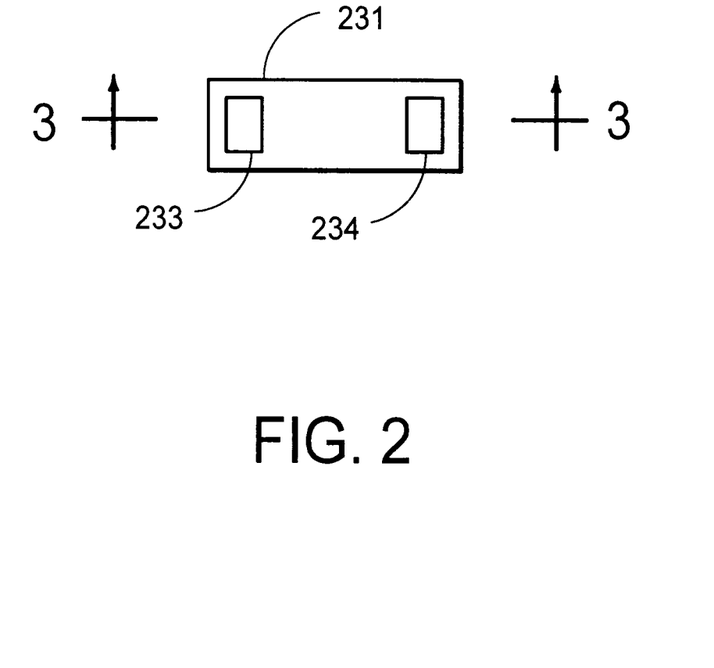
FIG. 2 illustrates a top view of a clip bond in accordance with an embodiment of the invention.
Figure 3:
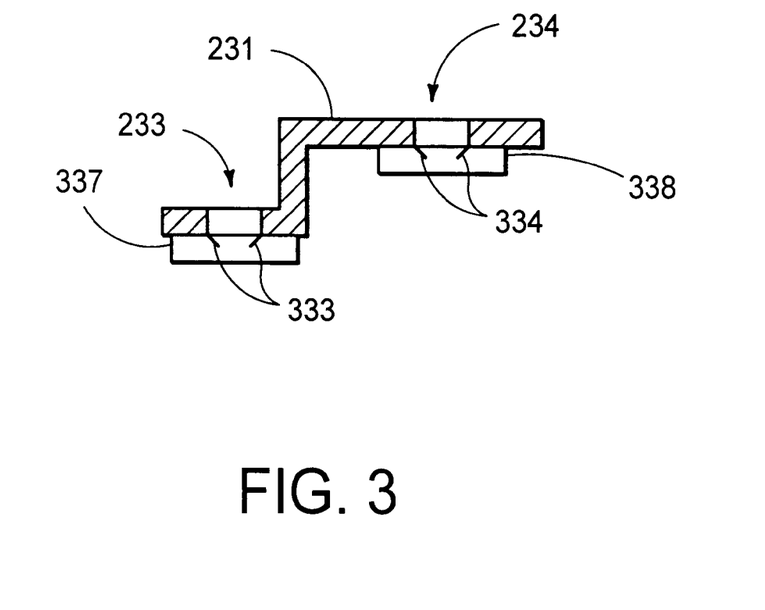
FIG. 3 illustrates a cross-sectional view of the clip bond of FIG. 2 taken along a section line 3—3 in FIG. 2 in accordance with an embodiment of the invention.

FIG. 2 illustrates a top view of a clip bond 231, and FIG. 3 illustrates a cross-sectional view of clip bond 231 taken along a section line 3—3 in FIG. 2. Clip bond 231 includes vias, notches, or holes 233 and 234 located at opposite ends of clip bond 231. As illustrated in FIG. 3, clip bond 231 also includes a plurality of burrs 333 and 334. Burrs 333 and 334 can be protrusions, rough or irregular protuberances, or a ragged edge extending from a main body of clip bond 231. Burrs 333 are located at or adjacent to a perimeter of hole 233, and burrs 334 are located at or adjacent to a perimeter of hole 234. Burrs 333 and 334 are located at an underside or bottom side of clip bond 231.

As illustrated in FIG. 3, a plurality of portions of an electrically conductive adhesive are also located at the bottom side of clip bond 231. In particular, a portion 337 of the electrically conductive adhesive is located adjacent to hole 233 and burrs 333, and a portion 338 of the electrically conductive adhesive is located adjacent to hole 234 and burrs 334. As an example, the electrically conductive material can be solder or a metallic-filled epoxy.

Clip bond 231 and portions 337 and 338 of the electrically conducted adhesive are heated to melt portions 337 and 338 of the electrically conductive adhesive. The configuration of holes 233 and 234 and burrs 333 and 334 serves to hold or retain portions 337 and 338 of the electrically conductive adhesive at holes 233 and 234 and burrs 333 and 334. After portions 337 and 338 of the electrically conductive adhesive are melted, clip bond 231 is coupled to the semiconductor component.

In a different embodiment of clip bond 231, the clip bond can include a single hole. In another embodiment of clip bond 231, the clip bond can have a single burr or multiple burrs without any holes. In yet another embodiment of clip bond 231, regardless of the number of holes present in the clip bond, each hole can have or be adjacent to a single burr. In the preferred embodiment, the burr or burrs are located at or adjacent to a perimeter of a hole to simplify the manufacturing process for the clip-bond and to optimize the retaining or holding characteristic of the hole and its accompanying burr or burrs.

Figure 4:
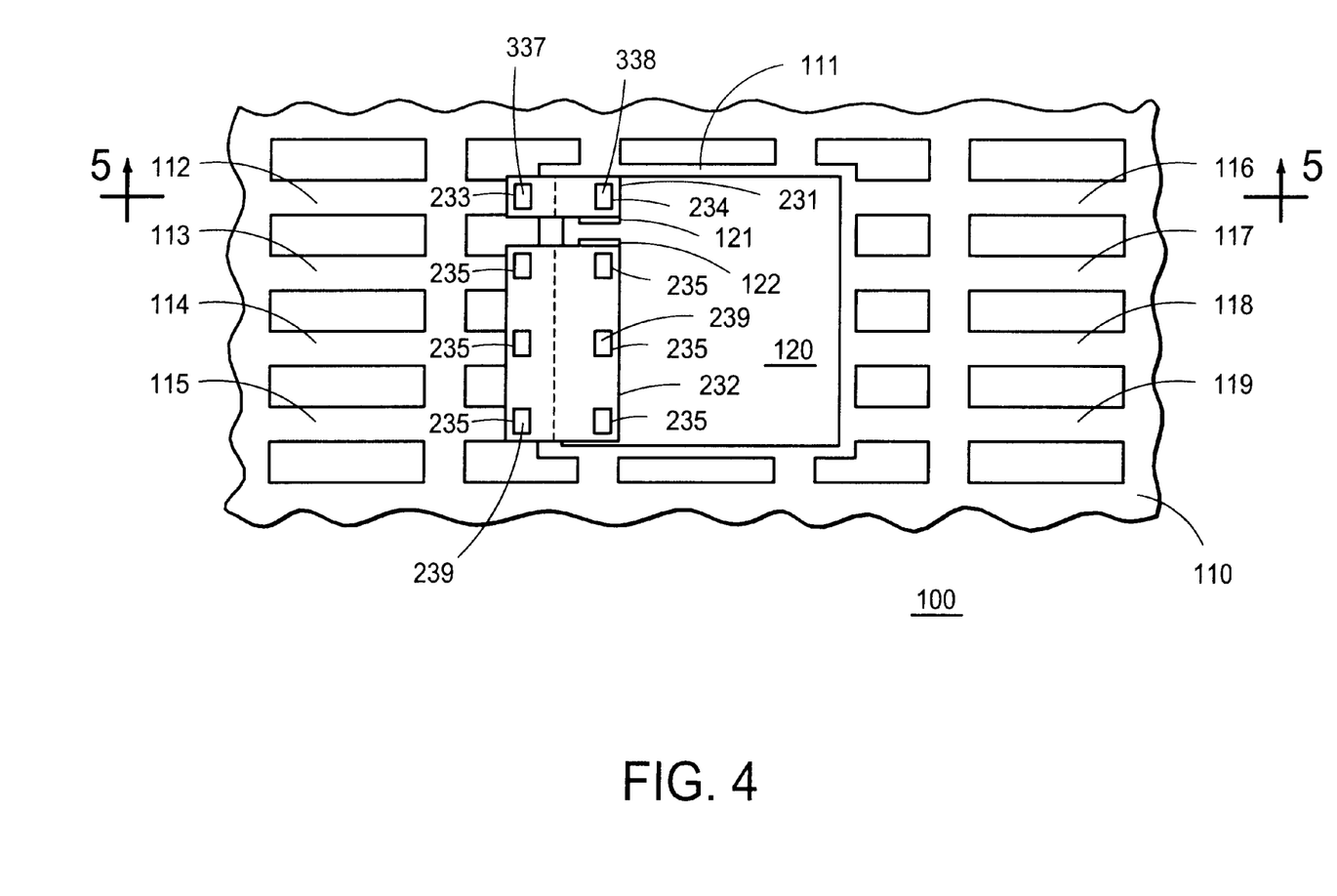
FIG. 4 illustrates a top view of the portion of the semiconductor component after a later step of a manufacturing process in accordance with an embodiment of the invention.
Figure 5:
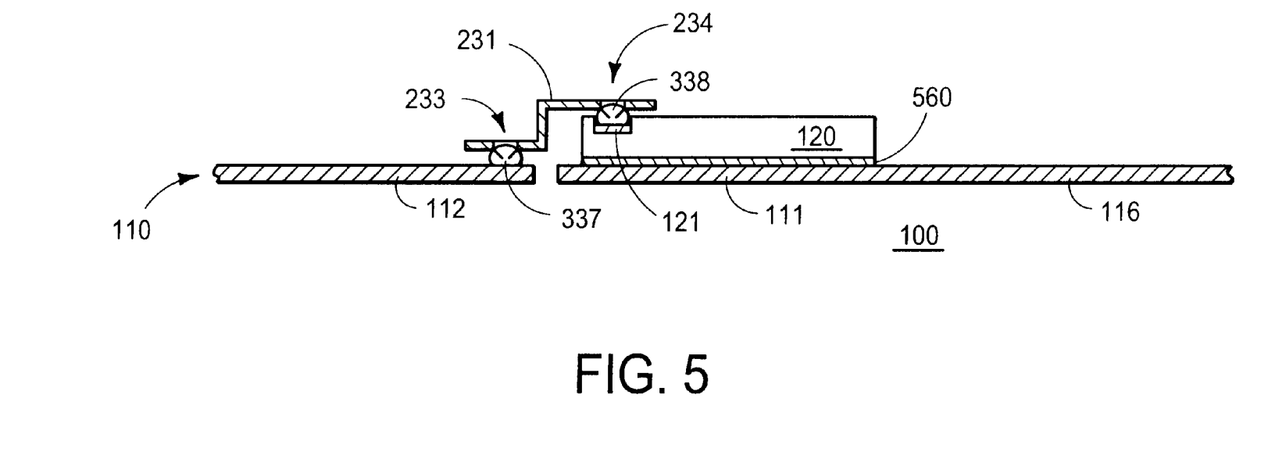
FIG. 5 illustrates a cross-sectional view of the portion of the semiconductor component of FIG. 4 taken along a section line 5—5 in FIG. 4 in accordance with an embodiment of the invention.

FIG. 4 illustrates a top view of the portion of semiconductor component 100 after a later step of the manufacturing process, and FIG. 5 illustrates a cross-sectional view of the portion of semiconductor component 100 taken along a section line 5—5 in FIG. 4. Clip bond 231 is located over chip 120 and lead frame 110, and clip bond 231 couples chip 120 to lead frame 110. Portion 337 of the electrically conductive adhesive is used to electrically couple and adhere a portion of clip bond 231 adjacent to hole 233 to lead 112 of lead frame of 110. Similarly, portion 338 of the electrically conductive adhesive is used to electrically couple and adhere a portion of clip bond 231 adjacent to hole 234 to bond pad 121 of chip 120.

Component 100 also includes a clip bond 232, which is similar to clip bond 231. Clip bond 232 has a plurality of holes 235. In the embodiment illustrated in FIG. 4, clip bond 232 has six of holes 235, but one skilled in the art will understand that clip bond 232 can have a different number of holes.

Clip bond 232 also includes at least one burr, but preferably a plurality of burrs, located at or adjacent to a perimeter of each of holes 235. The burr or burrs are located at a bottom side of clip bond 232. Portions 239 of the electrically conductive adhesive are located at or adjacent to the plurality of holes 235 and the plurality of burrs at the bottom side of clip bond 232. The electrically conductive adhesive and clip bond 232 electrically couple bond pad 121 of chip 120 to leads 113, 114, and 115 of lead frame 110.

Therefore, FIGS. 4 and 5 illustrate a plurality of portions of an electrically conductive adhesive located over a plurality of portions of semiconductor chip 120 and also over a plurality of portions of lead frame 110. In particular, a first one of the plurality of portions of the electrically conductive adhesive is located over a first portion of lead frame 110, and a second one of the plurality of portions of the electrically conductive adhesive is located over a second portion of lead frame 110. Furthermore, a third one of the plurality of portions of the electrically conductive adhesive is located over a first portion of semiconductor chip 120 and a fourth one of the plurality of portions of the electrically conductive adhesive is located over a second portion of semiconductor chip 120. Moreover, a plurality of clip bonds are located over the plurality of portions of the electrically conductive adhesive and are electrically coupled to semiconductor chip 120 through the plurality of portions of the electrically conductive adhesive.

A portion 560 of the electrically conductive adhesive is used to adhere semiconductor chip 120 to flag portion 111 of lead frame 110. Portion 560 of the electrically conductive adhesive can also be used to electrically couple semiconductor chip 120 to leads 116, 117, 118, and 119. Portion 560 of the electrically conductive adhesive can be the same or different from portions 337, 338, and 239 of the electrically conductive adhesive. As an example, portions 337, 338, and 239 can be comprised of solder or conductive epoxies while portion 560 is comprised of an anisotropic conductive film.

Figure 6:
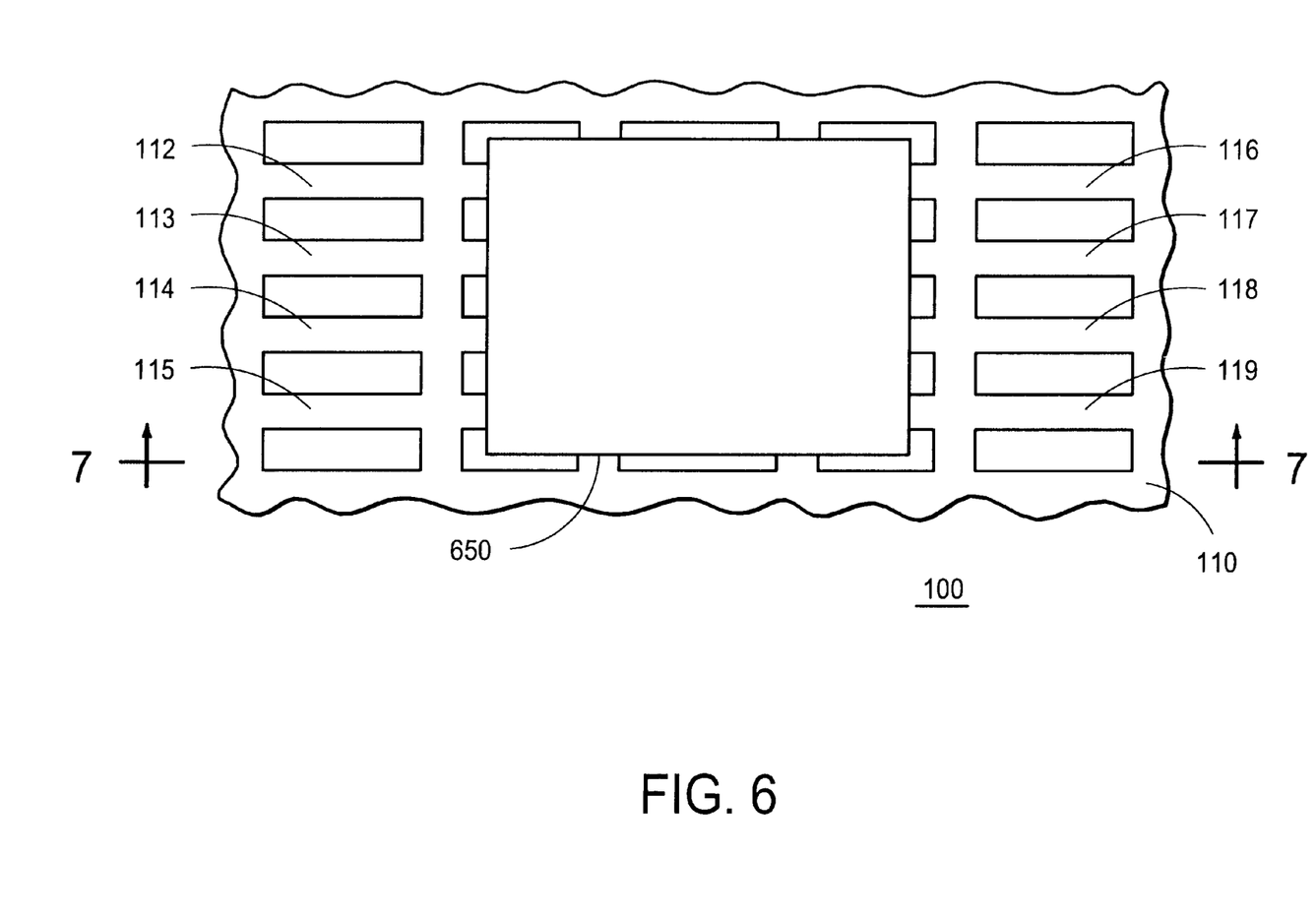
FIG. 6 illustrates a top view of the semiconductor component after a subsequent step in the manufacturing process in accordance with an embodiment of the invention.
Figure 7:
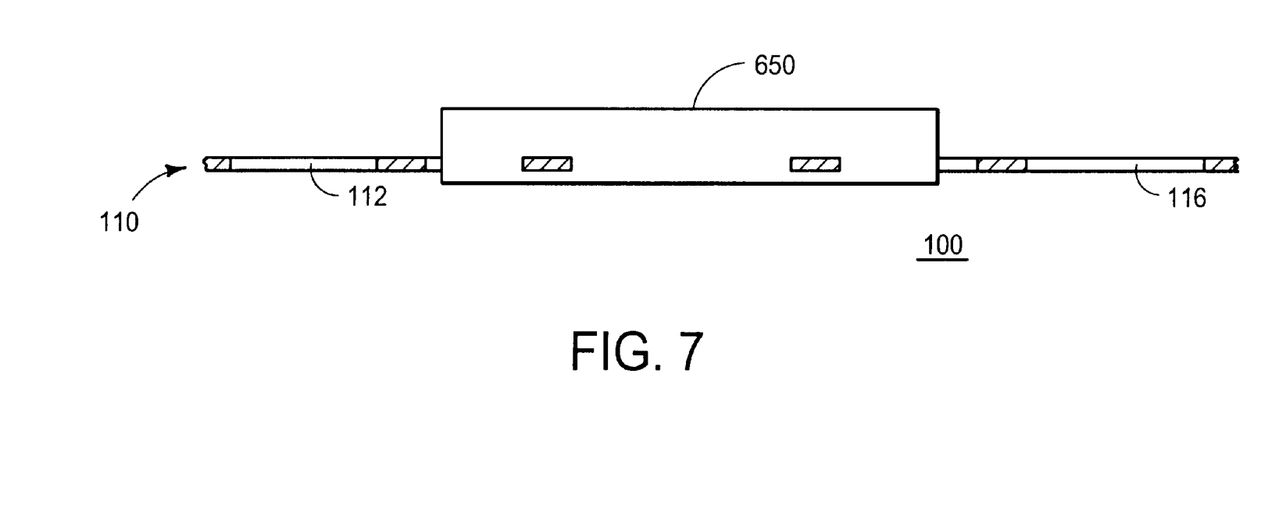
FIG. 7 illustrates a cross-sectional view of the semiconductor component of FIG. 6 taken along a section line 7—7 in FIG. 6 in accordance with an embodiment of the invention.

FIG. 6 illustrates a top view of semiconductor component 100 after a subsequent step in the manufacturing process, and FIG. 7 illustrates a cross-sectional view of component 100 taken along a section line 7—7 of FIG. 6. A packaging material 650 is molded around and encapsulates chip 120 (FIGS. 1, 4, and 5), at least a portion of lead frame 110, and the two clip bonds.

Figure 8:
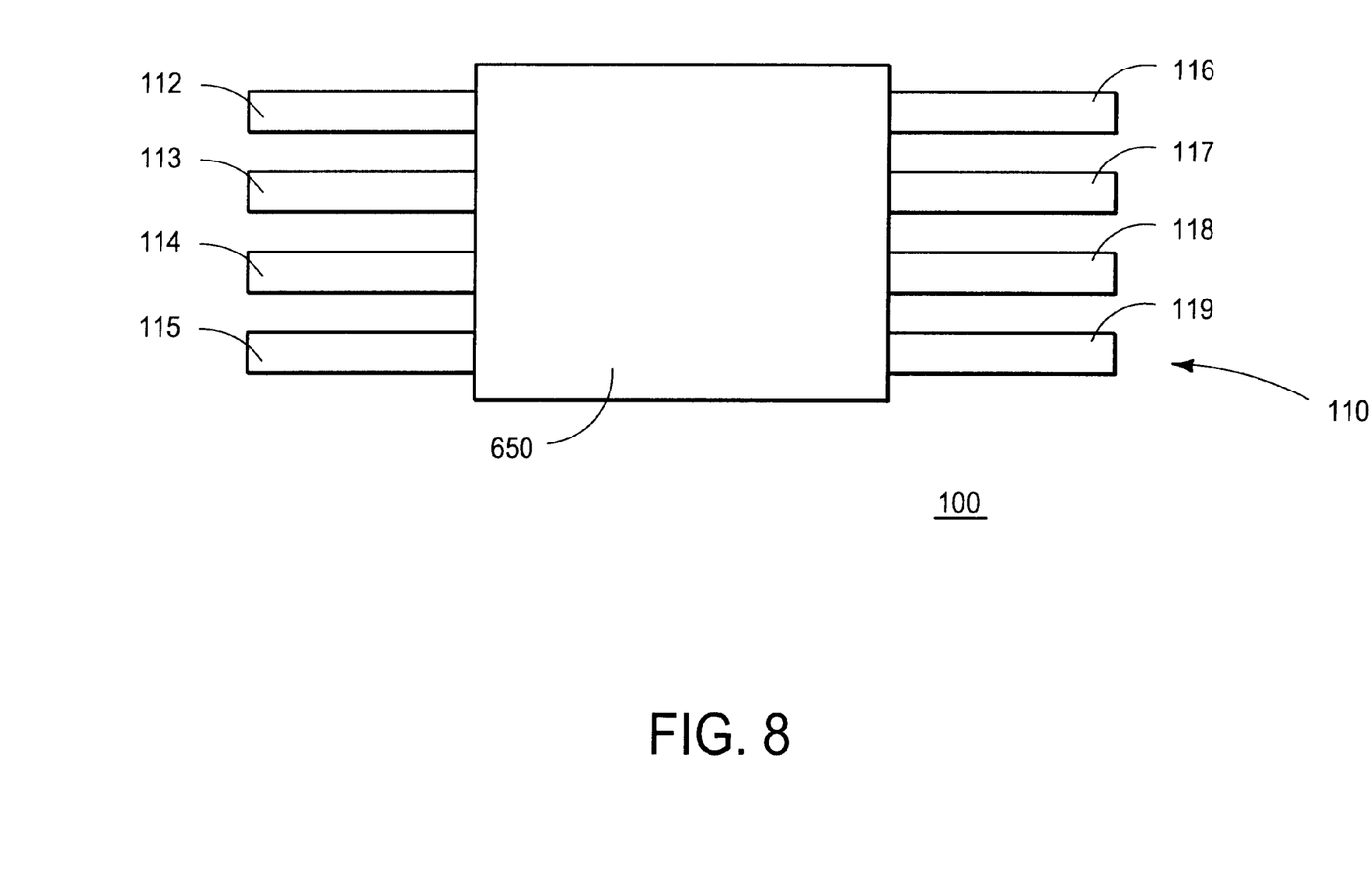
FIG. 8 illustrates a top view of the semiconductor component after an even later step in the manufacturing process in accordance with an embodiment of the invention.
Figure 9:
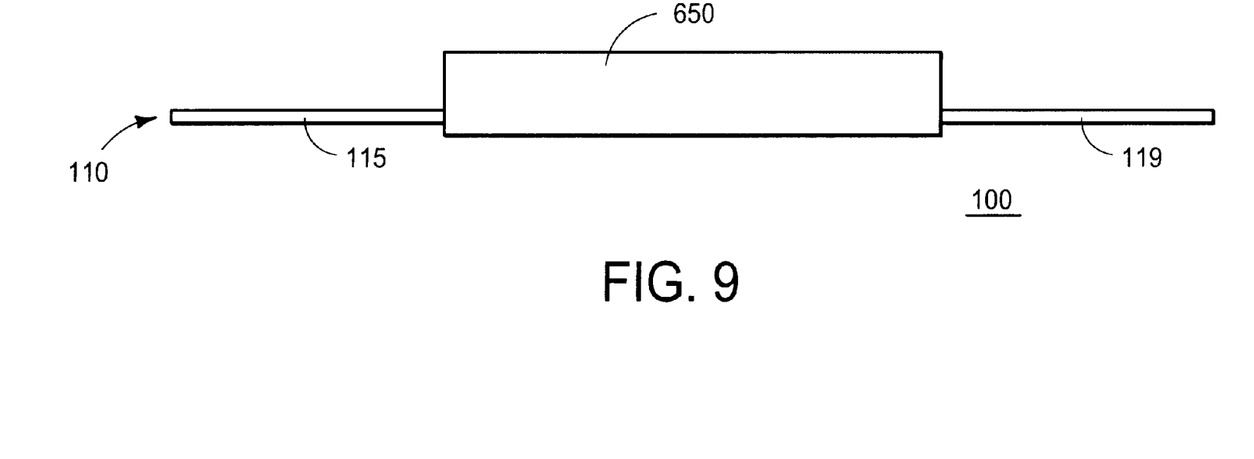
FIG. 9 illustrates a side view of the semiconductor component of FIG. 8 in accordance with an embodiment of the invention.

FIG. 8 illustrates a top view of semiconductor component 100 after an even later step in the manufacturing process, and FIG. 9 illustrates a side view of component 100 after the even later step in the manufacturing process. Lead frame 110 is trimmed to singulate component 100 and to remove the tie bars and the dam bars from lead frame 110.

Figure 10:
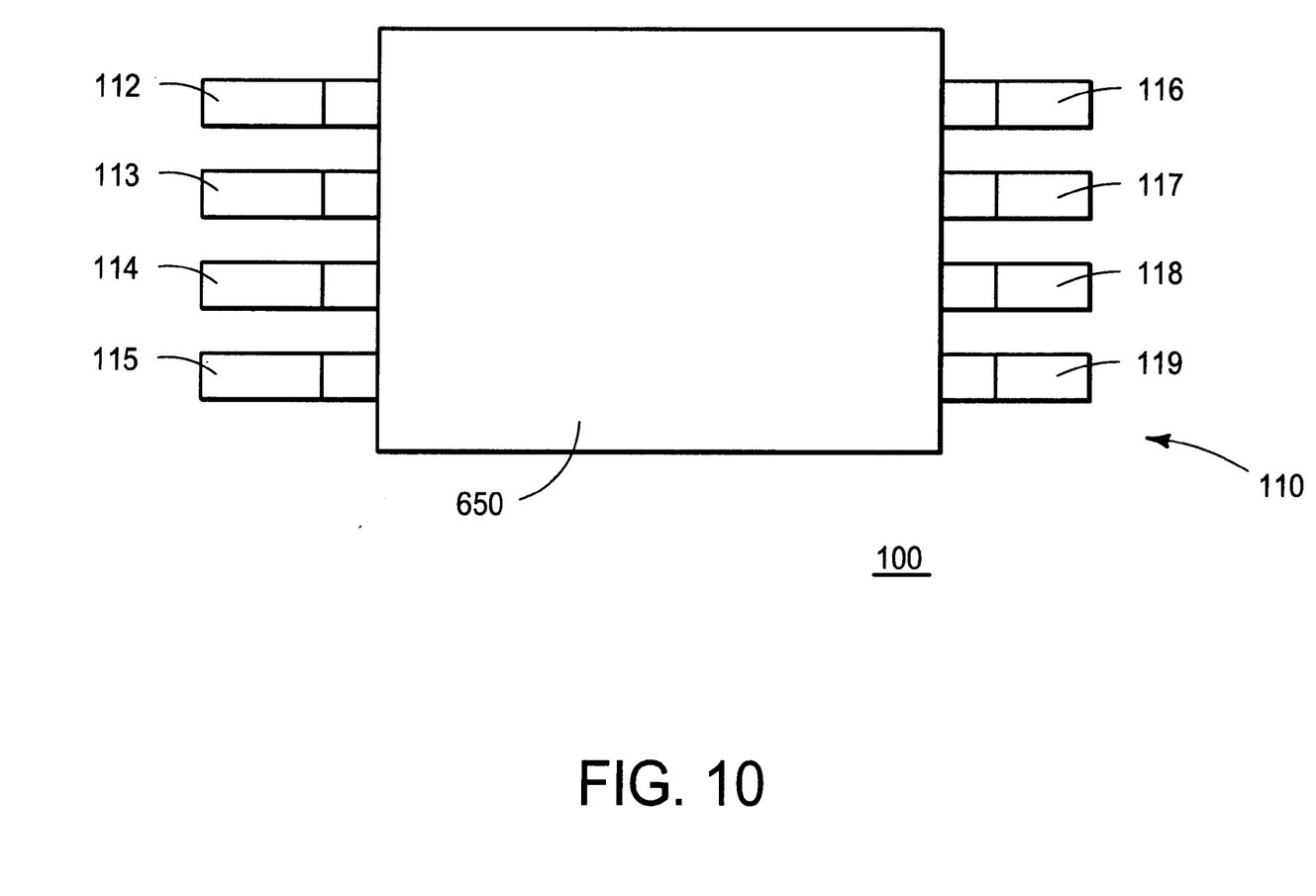
FIG. 10 illustrates a top view of the semiconductor component after a subsequent step in the manufacturing process in accordance with an embodiment of the invention.
Figure 11:
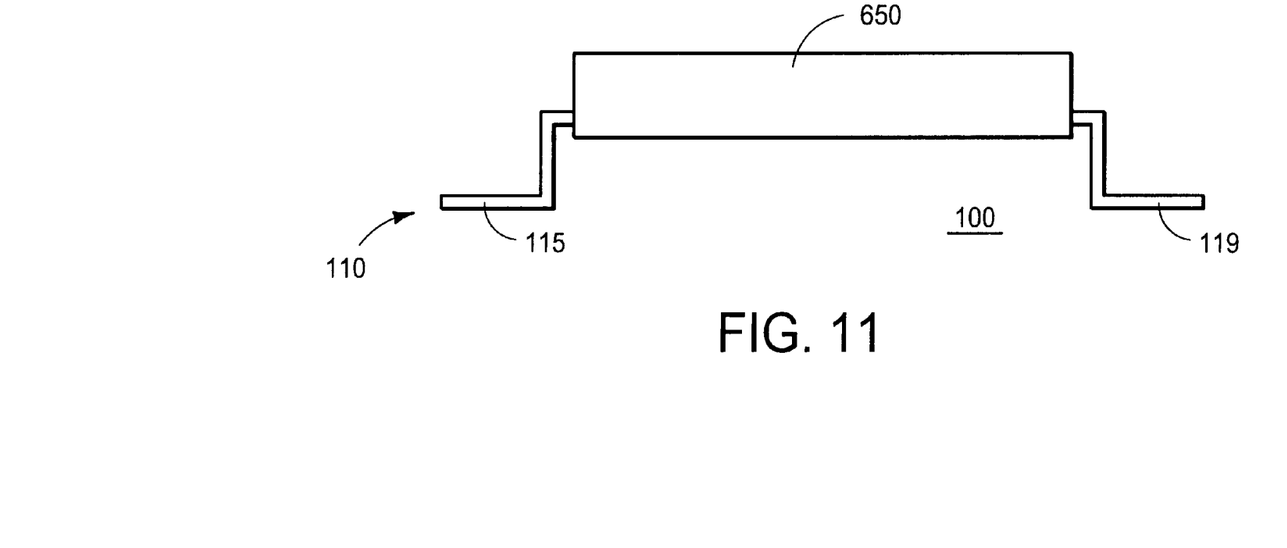
FIG. 11 illustrates a side view of the semiconductor component of FIG. 10 in accordance with an embodiment of the invention.

FIG. 10 illustrates a top view of a portion of semiconductor component 100 after a subsequent step in the manufacturing process, and FIG. 11 illustrates a side view of semiconductor component 100 after the subsequent step in the manufacturing process. Leads 112 through 119 of lead frame 110 are bent or formed into a gull-wing configuration. Leads 112 through 119 of lead frame 110 can also be bent into other configurations including, but not limited to, a surface-mount configuration.

Figure 12:
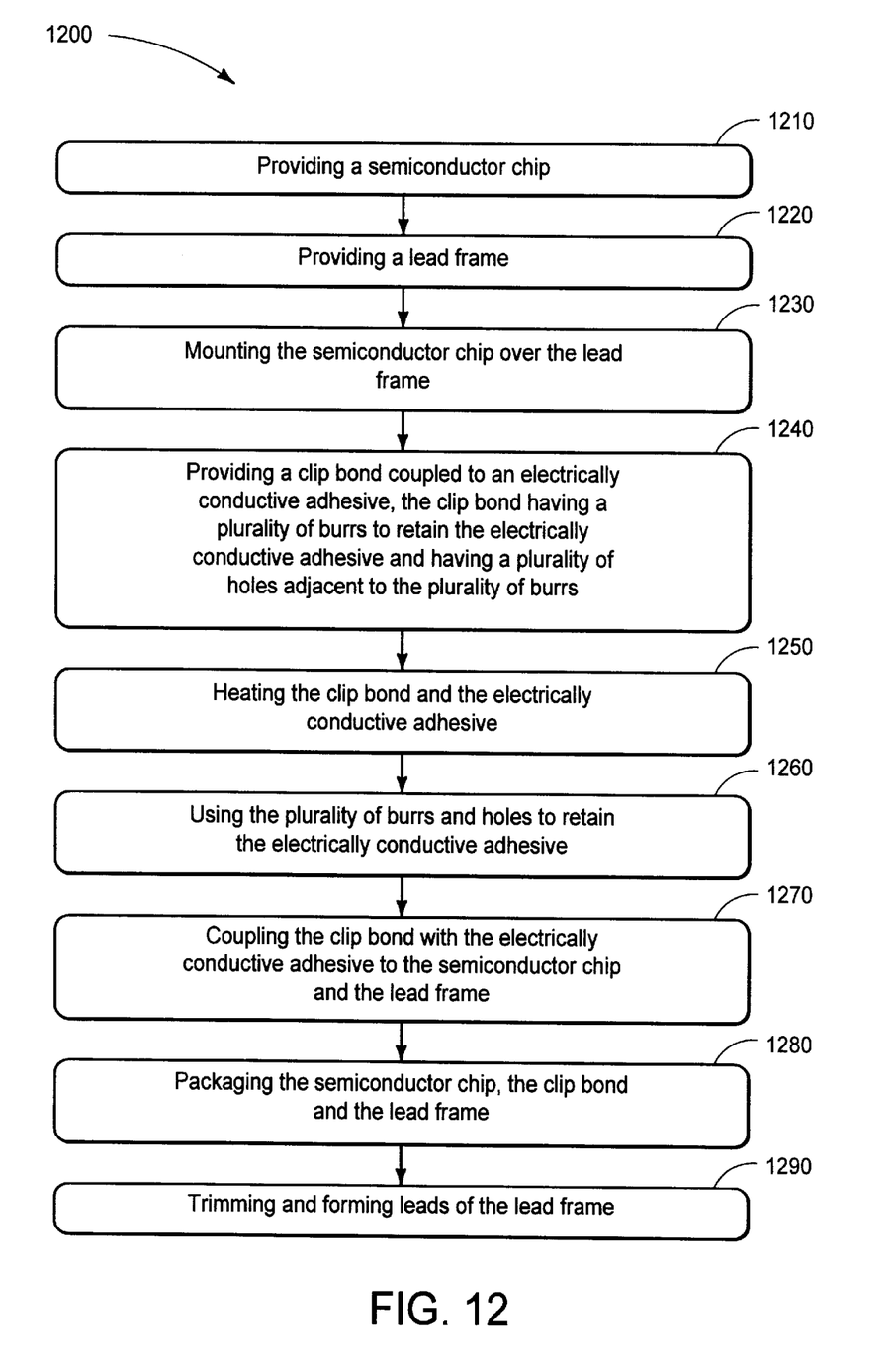
FIG. 12 illustrates a flow chart of a method of manufacturing a semiconductor component in accordance with an embodiment of the invention.

FIG. 12 illustrates a flow chart 1200 of a method of manufacturing semiconductor components. At a step 1210 of flow chart 1200, a semiconductor chip is provided. The semiconductor chip contains a semiconductor device. Step 1210 can be performed by purchasing a semiconductor chip having the semiconductor device already manufactured in it. Step 1210 can also be performed by manufacturing a semiconductor device in the semiconductor chip.

At a step 1220 of flow chart 1200, a lead frame is provided. The lead frame can be purchased, or the lead frame can be stamped from a sheet of metal. At a step 1230 of flow chart 1200, the semiconductor chip is mounted over the lead frame.

At a step 1240 of flow chart 1200, a clip bond is provided where the clip bond is coupled to an electrically conductive adhesive. The clip bond has at least one burr to retain the electrically conductive adhesive. In the preferred embodiment, the clip bond has a plurality of such burrs. The clip bond can also have at least one hole adjacent to the burr or burrs to retain the electrically conductive adhesive. In the preferred embodiment, the clip bond has a plurality of such holes.

Step 1240 can be performed by purchasing the clip bond or by stamping or punching the clip bond from a sheet of metal. This stamping or punching process can simultaneously define the shape and size of the clip bond and form the holes and burrs in the clip bond. The electrically conductive adhesive can be plated onto the clip bond.

At a step 1250 of flow chart 1200, the clip bond and the electrically conductive adhesive are heated. Step 1250 melts the electrically conductive adhesive. At a step 1260 of flow chart 1200, the pluralities of burrs and holes are used to retain the electrically conductive adhesive. In the preferred embodiment where the electrically conductive material is comprised of solder, the internal cohesive force of the solder and the design of the holes and the burrs will hold the solder, prevent the solder from dripping off of the clip bond, and concentrate the solder at desired bonding locations of the clip bond.

Next, at a step 1270 of flow chart 1200, the clip bond with the melted electrically conductive adhesive is coupled to the semiconductor chip and the lead frame. Step 1270 includes cooling the clip bond and the electrically conductive adhesive. Then, at a step 1280 of flow chart 1200, the semiconductor chip, the clip bond, and at least a portion of the lead frame are packaged or encapsulated in a single package. Subsequently, at a step 1290 of flow chart 1200, the leads of the lead frame are first trimmed and then formed.

One skilled in the art will understand that the method of flow chart 1200 does not need to include a solder reflow step so that the method can include the coupling of a plurality of clip bonds to a single semiconductor chip and lead frame. The coupling step or steps can be easily accomplished without suffering from an electrical shorting problem during a solder reflow process.

Figure 13:
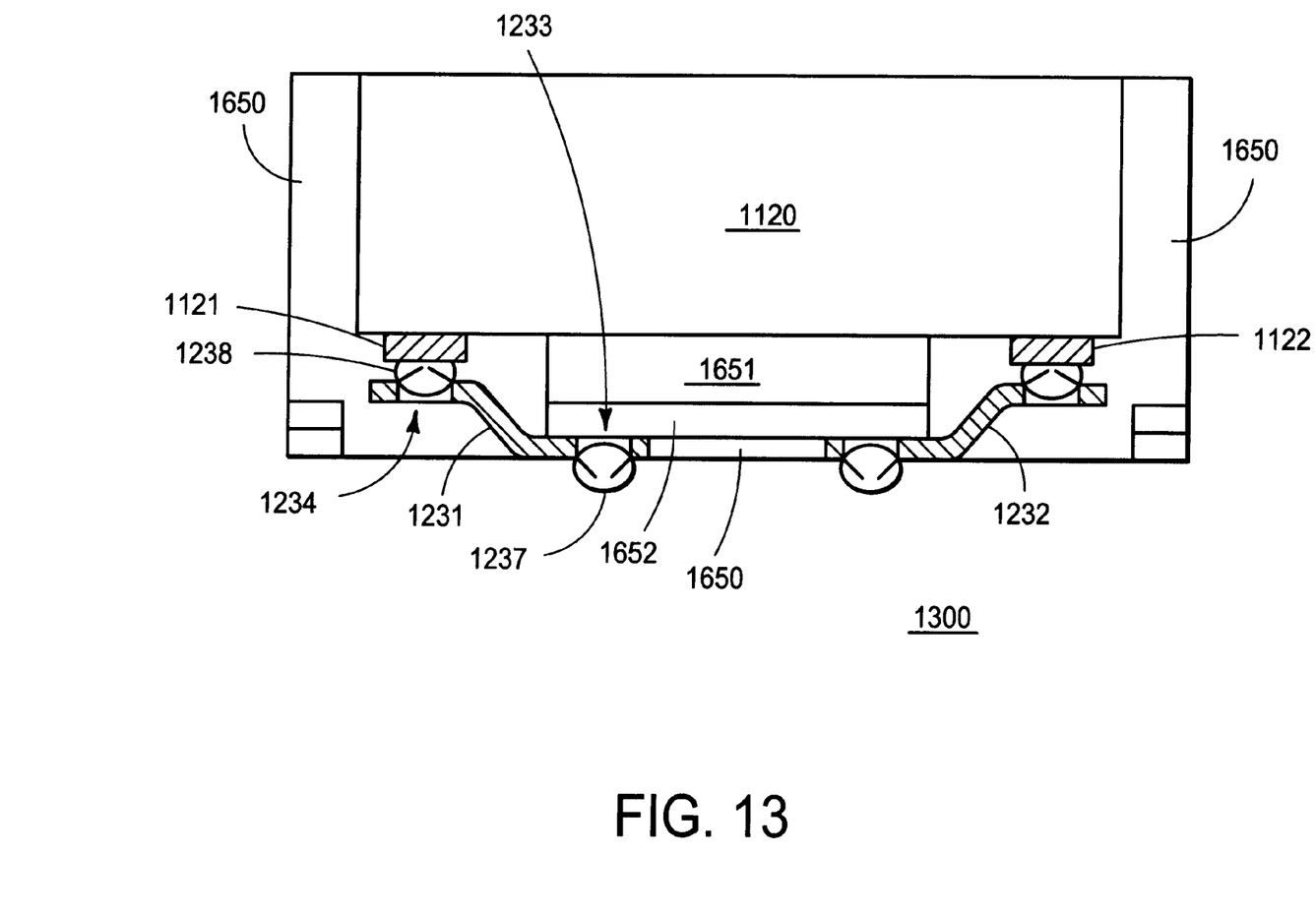
FIG. 13 illustrates a cross-sectional view of a different semiconductor component in accordance with an embodiment of the invention.

FIG. 13 illustrates a cross-sectional view of a semiconductor component 1300. Component 1300 includes a semiconductor chip 1120, which is similar to chip 120 in FIG. 2. Chip 1120 in FIG. 13 includes electrically conductive bond pads 1121 and 1122.

Component 1300 also includes a clip bond 1231, which is similar to clip bond 231 in FIGS. 2 and 3. Clip bond 1231 in FIG. 13 includes vias, notches, or holes 1233 and 1234. A plurality of burrs are located at or adjacent to a perimeter of each of holes 1233 and 1234. The burrs are located at the top and bottom sides of clip bond 1231. Component 1300 also includes a clip bond 1232, which is preferably identical to clip bond 1231.

Portions 1237 and 1238 of an electrically conductive adhesive are located adjacent to holes 1233 and 1234, respectively, of clip bond 1231. Portion 1238 of the electrically conductive adhesive electrically couples and adheres clip bond 1231 to bond pad 1121. Portion 1237 of the electrically conductive adhesive electrically couples and adheres semiconductor component 1300 to an external structure (not shown). Portions 1237 and 1238 of the electrically conductive adhesive are located at opposite sides of surfaces of clip bond 1231.

Semiconductor component 1300 can also include a polyimide tape 1652 for securing ends of clip bonds 1231 and 1232. Component 1300 can also include an elastomer material 1651 located between semiconductor chip 1120 and polyimide tape 1652. Semiconductor component 1300 also includes an encapsulant or packaging material 1650.

Therefore, an improved semiconductor component and method of manufacturing is provided to overcome the disadvantages of the prior art. The semiconductor component has a chip-to-lead frame interconnect system that has low parasitic conductances and resistances because of the use of clip bonds and the elimination of wire bonds. The method of manufacturing has low cost, has high throughput, and is compatible with small pitch interconnect schemes because of the use of clip bonds and the elimination of a solder reflow process. Although the invention has been described with reference to specific embodiments, it will be understood by those skilled in the art that various changes may be made without departing from the spirit or scope of the invention. For instance, the numerous details set forth herein such as, for example, the specific shapes, sizes, and configurations of the clip bonds are provided to facilitate the understanding of the invention and are not provided to limit the scope of the invention. Furthermore, the clip bonds described herein can be used in combination with wire bonds or other types of electrical interconnects. Accordingly, the disclosure of embodiments of the invention is intended to be illustrative of the scope of the invention and is not intended to be limiting. It is intended that the scope of the invention shall be limited only to the extent required by the appended claims.

What is claimed is:

1. A semiconductor component comprising:

a lead frame;

a semiconductor chip;

a plurality of portions of solder located over and electrically coupled to the semiconductor chip and located over and electrically coupled to the lead frame; and a plurality of clip bonds located over and electrically coupled to the plurality of portions of the solder, each of the plurality of clip bonds having a plurality of burrs to retain the plurality of portions of the solder.

2. The semiconductor component of claim 1 wherein:

each of the plurality of clip bonds further comprises:

a plurality of holes located over the solder, each of the plurality of holes having a perimeter, wherein:

a plurality of the plurality of burrs of the clip bond are located adjacent to the perimeter of each of the plurality of holes of the clip bond.

3. A semiconductor component comprising:

a lead frame;

a semiconductor chip;

a plurality of portions of solder located over and electrically coupled to the semiconductor chip and located over and electrically coupled to the lead frame;

a plurality of clip bonds located over and electrically coupled to the plurality of portions of the solder, each of the plurality of clip bonds having a plurality of burrs to retain the plurality of portions of the solder, wherein each of the plurality of clip bonds further comprises:
  a plurality of holes located over the solder, each of the plurality of holes having a perimeter,
  wherein:
    a plurality of the plurality of burrs of the clip bond are located adjacent to the perimeter of each of the plurality of holes of the clip bond, a first one of the plurality of portions of the solder is located over a first portion of the lead frame;

a second one of the plurality of portions of the solder is located over a second portion of the lead frame;

a third one of the plurality of portions of the solder is located over a first portion of the semiconductor chip;

a fourth one of the plurality of portions of the solder is located over a second portion of the semiconductor chip;

a first one of the plurality of holes of a first one of the plurality of clip bonds is located over the first one of the plurality of portions of the solder;

a second one of the plurality of holes of the first one of the plurality of clip bonds is located over the third one of the plurality of portions of the solder;

a first one of the plurality of holes of a second one of the plurality of clip bonds is located over the second one of the plurality of portions of the solder; and a second one of the plurality of holes of the second one of the plurality of clip bonds is located over the fourth one of the plurality of portions of the solder.

* * * * *